United States Patent
Abe

(10) Patent No.: US 8,129,940 B2
(45) Date of Patent: Mar. 6, 2012

(54) VEHICLE CONTROL SYSTEM FOR CONTROLLING CHARGING AND DISCHARGING CONTROL OF A BATTERY

(75) Inventor: Kunihiro Abe, Higashimurayama (JP)

(73) Assignee: Denso Corporation, Kariya (JP)

( * ) Notice: Subject to any disclaimer, the term of this patent is extended or adjusted under 35 U.S.C. 154(b) by 495 days.

(21) Appl. No.: 12/320,042

(22) Filed: Jan. 15, 2009

(65) Prior Publication Data

US 2009/0184683 A1     Jul. 23, 2009

(30) Foreign Application Priority Data

Jan. 23, 2008   (JP) ................... 2008-012457

(51) Int. Cl.
*H02J 7/14*     (2006.01)
*H02J 7/00*     (2006.01)

(52) U.S. Cl. ........ 320/104; 320/144; 320/150; 320/105; 324/430

(58) Field of Classification Search .................. 320/104, 320/105, 144, 150; 324/430
See application file for complete search history.

(56) References Cited

U.S. PATENT DOCUMENTS

| | | | |
|---|---|---|---|
| 6,787,935 B2 | 9/2004 | Heim | |
| 7,061,247 B2 * | 6/2006 | Inokuchi et al. | 324/430 |
| 7,705,556 B2 * | 4/2010 | Abe | 320/104 |
| 2003/0057770 A1 | 3/2003 | Heim | |

FOREIGN PATENT DOCUMENTS

| | | |
|---|---|---|
| JP | U-6-31304 | 4/1994 |
| JP | A-10-215527 | 8/1998 |
| JP | A-2003-517613 | 5/2003 |
| JP | A-2003-235268 | 8/2003 |
| JP | A-2005-073479 | 3/2005 |
| JP | A-2007-16648 | 1/2007 |
| JP | A-2007-230513 | 9/2007 |
| WO | WO 01/44825 A1 | 6/2001 |

OTHER PUBLICATIONS

Japanese Office Action issued in Japanese Patent Application No. 2008-012457 on Nov. 24, 2009 (with translation).
Aug. 24, 2010 Office Action issued in Japanese Patent Application No. 2008-012457 (with translation).
Jun. 15, 2011 Office Action issued in Chinese Patent Application No. 200910008707.6 with translation.

* cited by examiner

*Primary Examiner* — Samuel Berhanu
(74) *Attorney, Agent, or Firm* — Oliff & Berridge, PLC

(57) ABSTRACT

A vehicle control system has a battery mounted to a vehicle, a vehicle alternator charging the battery, a battery current detection device detecting a charging/discharging current of the battery, a voltage regulation device regulating an output voltage of the vehicle alternator to a specified output voltage, and a temperature sensor mounted to the inside of the battery current detection device. One terminal of a shunt resistance is connected to a negative terminal of the battery through a battery clump, and the other terminal of the shunt resistance is grounded. The temperature sensor is placed close to the shunt resistance. This structure enables the temperature sensor to detect the temperature of the battery with a high accuracy while considering the temperature characteristics of the shunt resistance.

6 Claims, 4 Drawing Sheets

VEHICLE CONTROL SYSTEM FOR CONTROLLING CHARGING AND DISCHARGING CONTROL OF A BATTERY

CROSS-REFERENCE TO RELATED APPLICATION

This application is related to and claims priority from Japanese Patent Application No. 2008-012457 filed on Jan. 23, 2008, the contents of which are hereby incorporated by reference.

BACKGROUND OF THE INVENTION

1. Field of the Invention

The present invention relates to vehicle control systems for controlling charging and discharging of a battery, mounted to vehicles such as passenger vehicles and trucks, based on temperature characteristics of the battery and for controlling electric-power generation condition of a vehicle alternator based on battery conditions such as a temperature of the battery.

2. Description of the Related Art

Recently, the reduction of carbon dioxide ($CO_2$) is strongly demanded for prevention of global warming. Achieving this demand needs the improvement of fuel consumption for passenger vehicles and trucks. This is also a strong demand in the automobile industry field.

Conventional techniques have proposed various methods to improve the fuel consumption of vehicles based on controlling the charging of an on-vehicle battery using more-detailed information about the condition of an on-vehicle battery. For example, one conventional method controls the battery charging operation, and reduces a load of the engine of a vehicle when the vehicle is accelerated. The conventional method also increases the amount of electric energy, to be charged to the on-vehicle battery, using regenerated energy obtained when the vehicle is decelerated. That control is a well-known technique. Such a vehicle is equipped with a current sensor in order to precisely monitor the charging and discharging balance of the on-vehicle battery.

By the way, the charging and discharging characteristics of a lead battery mounted to a vehicle fluctuates according to the chemical reaction state of the lead battery. In particular, the charging condition greatly fluctuates according to the temperature of the lead battery, namely, at a high temperature and a low temperature. This means there is a necessity to accurately control the charging voltage for the lead battery based on its temperature. Not controlling the charging voltage based on the temperature of a lead battery will cause a poor charged state of the lead battery at a low temperature, and also cause an over charged state thereof at a high temperature.

In order to avoid this problem, a conventional technique controls the charging and discharging operation for the lead battery based on an estimated temperature of the lead battery. For example, Japanese patent laid open publication No. JP H10-215527 has disclosed such a conventional technique. However, the conventional technique JP H10-215527 performs the charging and discharging control based on the estimated temperature of the battery with relatively a low accuracy. It is accordingly difficult for the conventional technique to perform the charging and discharging control for the battery with more accuracy from the viewpoint of fuel consumption improvement. Still further, the conventional technique JP H10-215527 limits the space for the battery to be mounted to the vehicle.

Recently, various types of devices that purify exhaust gas and improve the fuel consumption of a vehicle are mounted into the engine room of the vehicle in addition to the battery. This limits the mounting space for the battery or largely changes the mounting location of the battery in the engine room of the vehicle. For example, there is a case to mount the battery into a trunk room of the vehicle. This also causes various problems.

SUMMARY OF THE INVENTION

It is an object of the present invention to provide a vehicle control system for controlling charging and discharging of a battery with high accuracy regardless of any battery mounting condition onto a vehicle. To achieve the above purpose, the present invention provides a vehicle control system having a battery, a vehicle alternator, a battery current detection device, a voltage regulation device, and a temperature sensor. The battery is mounted to a vehicle. The vehicle alternator generates electric power and charges the battery with the electric power. The battery current detection device detects a charging and discharging current of the battery. The voltage regulation device regulates an output voltage of the vehicle alternator to a specified output voltage. The temperature sensor is mounted to the inside of the battery current detection device, which detects the temperature of the battery.

There is a known technique to calculate a charging and discharging current of a battery mounted to a vehicle in order to obtain a more-detailed and more accurate charging condition of the battery in views of improving the fuel consumption of the vehicle. In general, the known calculation technique uses various types of current sensors. However, because each current sensor has its own temperature characteristics, it is necessary to manage the temperature of each current sensor with high accuracy and to accurately detect the temperature of each current sensor. On the other hand, according to the present invention, the battery detection device is equipped with the temperature sensor. The structure of the vehicle control system according to the present invention can easily detect the charging and discharging current while considering the temperature characteristics of the battery. It is thereby possible to perform the charging and discharging current control for the battery with high accuracy.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
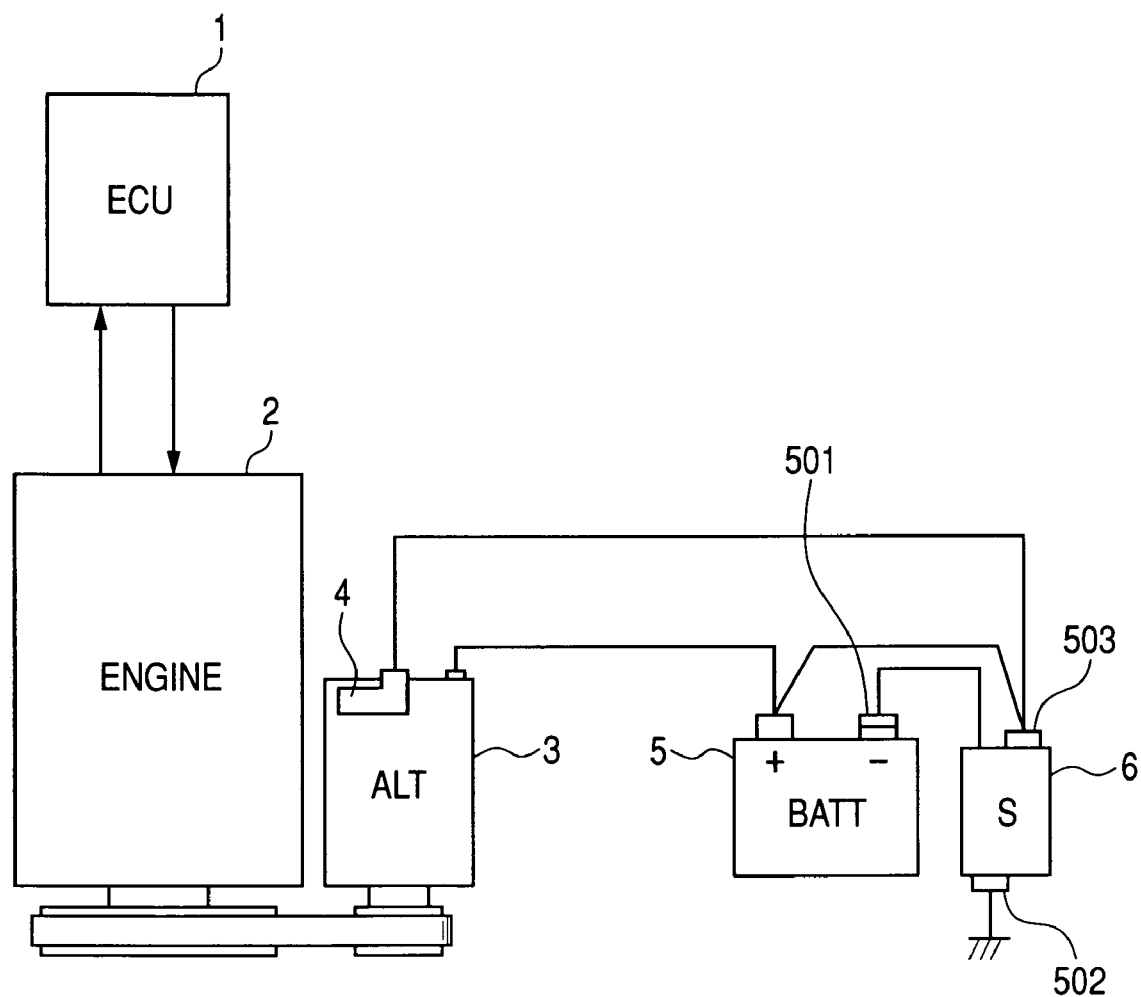
FIG. 1 is a diagram showing an entire configuration of the vehicle control system according to an embodiment of the present invention.

Hereinafter, various embodiments of the present invention will be described with reference to the accompanying drawings. In the following description of the various embodiments, like reference characters or numerals designate like or equivalent component parts throughout the several diagrams.

Embodiment

A description will be given of a vehicle control system according to an embodiment with reference to FIG. 1 to FIG. 4. The vehicle control system of the embodiment performs charging and discharging control for a battery with high accuracy regardless of the mounting condition of the battery to a vehicle.

FIG. 1 is a diagram showing an entire configuration of the vehicle control system according to the embodiment of the present invention. As briefly shown in FIG. 1, the vehicle control system comprises an electric control unit (ECU) 1, an engine 2 such as a gasoline engine and a diesel engine, a vehicle alternator (ALT) 3, a battery (BAT) 5, and a battery current detection device (S) 6.

The ECU 1 is an outside control device for controlling the output of the engine 2 that is mounted to a vehicle. The vehicle alternator 3 is rotatably driven by the output power of the engine 2 through a belt in order to generate the electric power. The vehicle alternator 3 supplies generated electric power to the battery 2 and other electronic loads (not shown). The vehicle alternator 3 is equipped with an electric power generation control device 4. The electric power generation control device 4 serves as a voltage regulation device (or a voltage regulator for short) capable of controlling an exciting current in order to control the output voltage of the alternator 3. The battery current detection device 6 is placed near the battery 5 and detects various conditions of the battery 5, for example, a charging current, a discharging current, and the temperature of the battery 5.

Figure 2:
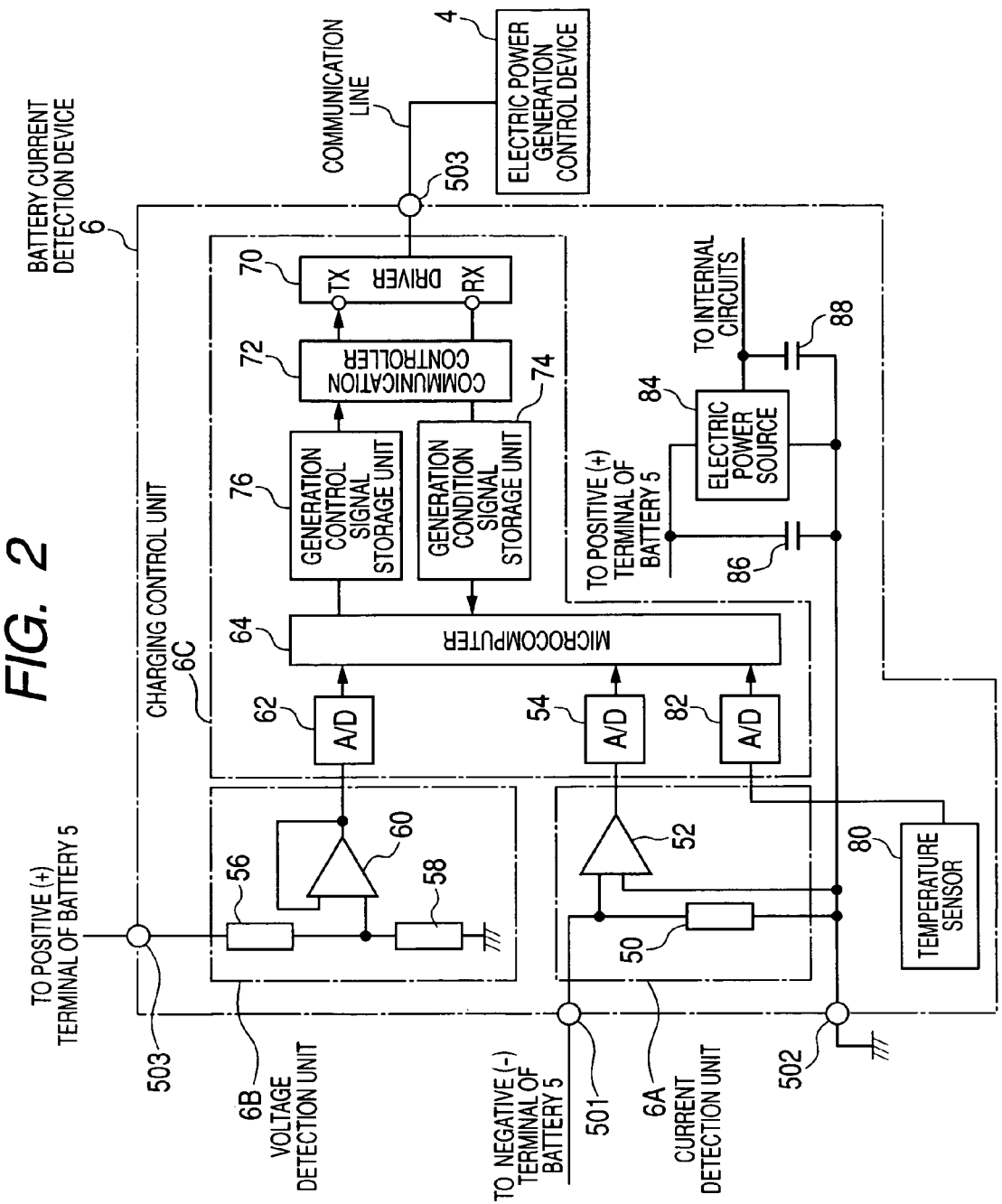
FIG. 2 is a detailed block diagram of a battery current detection device in the vehicle control system of the embodiment according to the present invention.

FIG. 2 is a detailed block diagram of the battery current detection device 6 in the vehicle control system of the embodiment according to the present invention. FIG. 2 only shows the main components of the battery current detection device 6. FIG. 2 omits a mounting assembly for the battery current detection device 6 to the battery and a casing which accommodates the main components of the battery current detection device 6. As shown in FIG. 2, the battery current detection device 6 is comprised of a shunt resistance 50, amplifiers 52 and 60, analogue to digital converters (A/D convertors) 54, 62, and 82, resistances 56 and 58, a microcomputer 64, a driver 70, a digital communication controller 72, a generation condition signal storage unit 74, a generation control signal storage unit 76, a temperature sensor 80, an electric power circuit 84, and capacitances 86 and 88.

The shunt resistance 50 is a resistance for detecting a charging current and a discharging current of the battery 50. One end terminal of the shunt resistance 50 is electrically connected to a negative (−) electrode terminal of the battery 5 through a battery clamp 501. The other end terminal of the shunt resistance 50 is earthed, namely, electrically connected to the ground. For example, the amplifier 52 is a differential amplifier to amplify the voltage between both the ends of the shunt resistance 50. The A/D converter 54 converts the amplified voltage into digital data. The A/D converter 54 then transfers the digital data to the microcomputer 64. When receiving the digital data, the microcomputer 64 stores the digital data.

The resistances 56 and 58 form a dividing circuit to detect the terminal voltage (or the battery voltage) of the battery 5. One end terminal of the dividing circuit is electrically connected to a positive (+) electrode terminal of the battery 5, and the other end terminal thereof is electrically connected to the ground. The amplifier 60 serves as a buffer circuit electrically connected to the output terminal of the dividing circuit formed by the resistances 56 and 58. The A/D converter 62 converts the output voltage of the amplifier 60 into digital data. The A/D converter 62 then transfers the digital data to the microcomputer 64.

The temperature sensor 80 detects the temperature of the battery 5. When detecting the temperature of the battery 5, the temperature sensor 80 outputs a voltage corresponding to the detected temperature of the battery 5 to the A/D converter 82.

The A/D converter 82 transfers the digital data to the microcomputer 64. The microcomputer 64 receives the digital data transferred from the A/D converter 82. The microcomputer 64 further receives the digital data transferred from both the A/D converters 54 and 62. The microcomputer 64 performs arithmetic operations based on the received digital data in order to obtain the battery condition of the battery 5 such as a charged state. The microcomputer 64 determines a regulation voltage of the vehicle alternator 3 based on the battery condition of the battery 5. Specifically, the microcomputer 64 compensates for the temperature characteristics of the shunt resistance 50 based on the detected temperature of the battery 5 detected by the temperature sensor 80 in order to detect a correct charging and discharging current for the battery 5. The microcomputer 64 stores and accumulates the correct charging and discharging current. The microcomputer 64 judges the charged state of the battery 5 using the accumulated charging and discharging currents. The microcomputer 64 determines the regulation voltage based on the judgment result and the temperature of the battery 5 detected by the temperature sensor 80. For example, the less the battery 5 has the charged electric power, or the lower the temperature of the battery 5 detected by the temperature sensor 80 is, the higher that microcomputer 64 increases the regulation voltage.

The electric power circuit 84 supplies the electric power to the microcomputer 64 and other circuits to operate.

The driver 70 and the digital communication controller 72 in the battery current detection device 6 transfer/receive control signals to/from the electric power generation control device 4 through a communication line. As shown in FIG. 2, the communication line connects the electric power generation control device 4 and a connector 503 of the battery current detection device 6.

When receiving the digital modulated signal (or a generation condition transmission signal) transferred from the electric power generation control device 4 through the communication line, the driver 70 transfers the received digital modulated signal to the digital communication controller 72. The digital communication controller 72 demodulates the digital modulated signal into the generation condition signal and then stores the generation condition signal into the generation condition signal storage unit 74.

When the microcomputer 64 stores the generation control signal into the generation control signal storage unit 76, the digital communication controller 72 demodulates the generation control signal to digital data using a predetermined format.

The driver 70 transfers this demodulated signal (or the digital demodulated signal) to the electric power generation control device 4 through the communication line.

The vehicle control system according to the embodiment of the present invention described above performs the bi-directional data transmission between the electric power generation control device 4 and the battery current detection device 6. The present invention is not limited by the above embodiment. For example, it is possible for the vehicle control system to perform one directional transmission from the battery current detection device 6 to the electric power generation control device 4. This can reduce the manufacturing cost of the vehicle control system because of reducing the function of the communication direction.

The shunt resistance 50 and the amplifier 52 form a current detection unit 6A. The resistances 56, 58, and the amplifier 60 form a voltage detection unit 6B. The A/D converters 54, 62, and 82, the microcomputer 64, the driver 70, the digital communication controller 72, the generation condition signal storage unit 74, the generation control signal storage unit 76 form a charging control circuit 6C.

Figure 3:
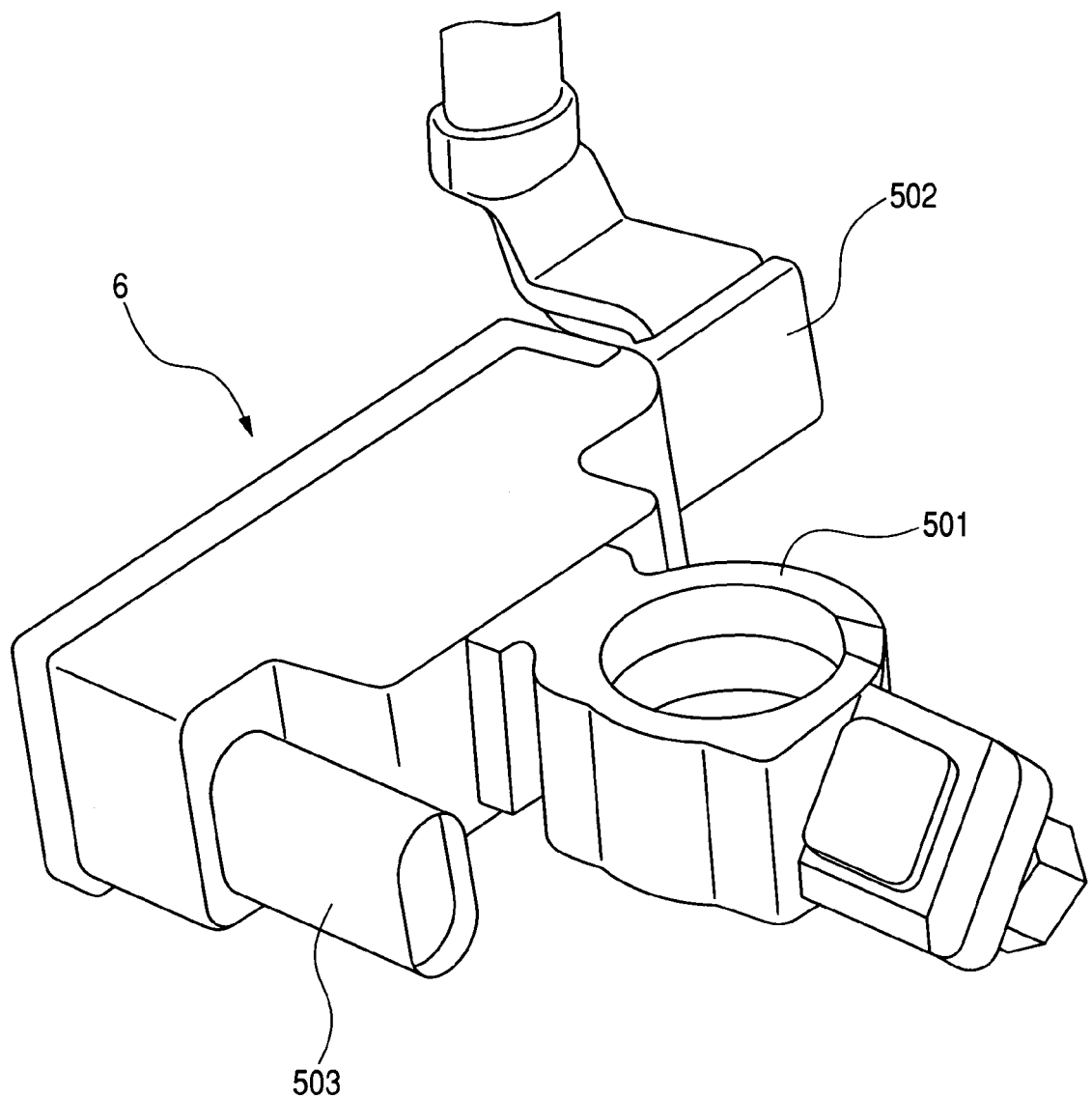
FIG. 3 is a diagram showing an external appearance of the battery current detection device shown in FIG. 2.

FIG. 3 is a diagram showing an external appearance of the battery current detection device 6 in the vehicle control system according to the embodiment of the present invention. In addition, FIG. 3 shows a mold assembly in which the current detection unit 6A having the shunt resistance 50, the voltage detection unit 6B, the charging control circuit 6C, the temperature sensor 80, the electric power circuit 84, and others are assembled together and molded.

As shown in FIG. 3, the battery clamp 501 and an earth terminal 502 are projected from the molded battery current detection device 6. The battery clamp 501 is electrically connected to a negative terminal of the battery 5. On the other hand, the earth terminal 502 is electrically connected to the ground.

The connector 503 and the battery current detection device 6 are assembled together using mold resin. Through electrical wires in the connector 503, the battery current detection device 6 is electrically connected to the positive terminal of the battery 5 and communicates with the electric power generation control device 4. As described above, in the vehicle control system according to the embodiment of the present invention described above, the battery current detection device 6 and the battery clamp 501 are assembled together. That is, the battery current detection device 6 and the terminal to be connected to the battery 5 are assembled together.

Figure 4:
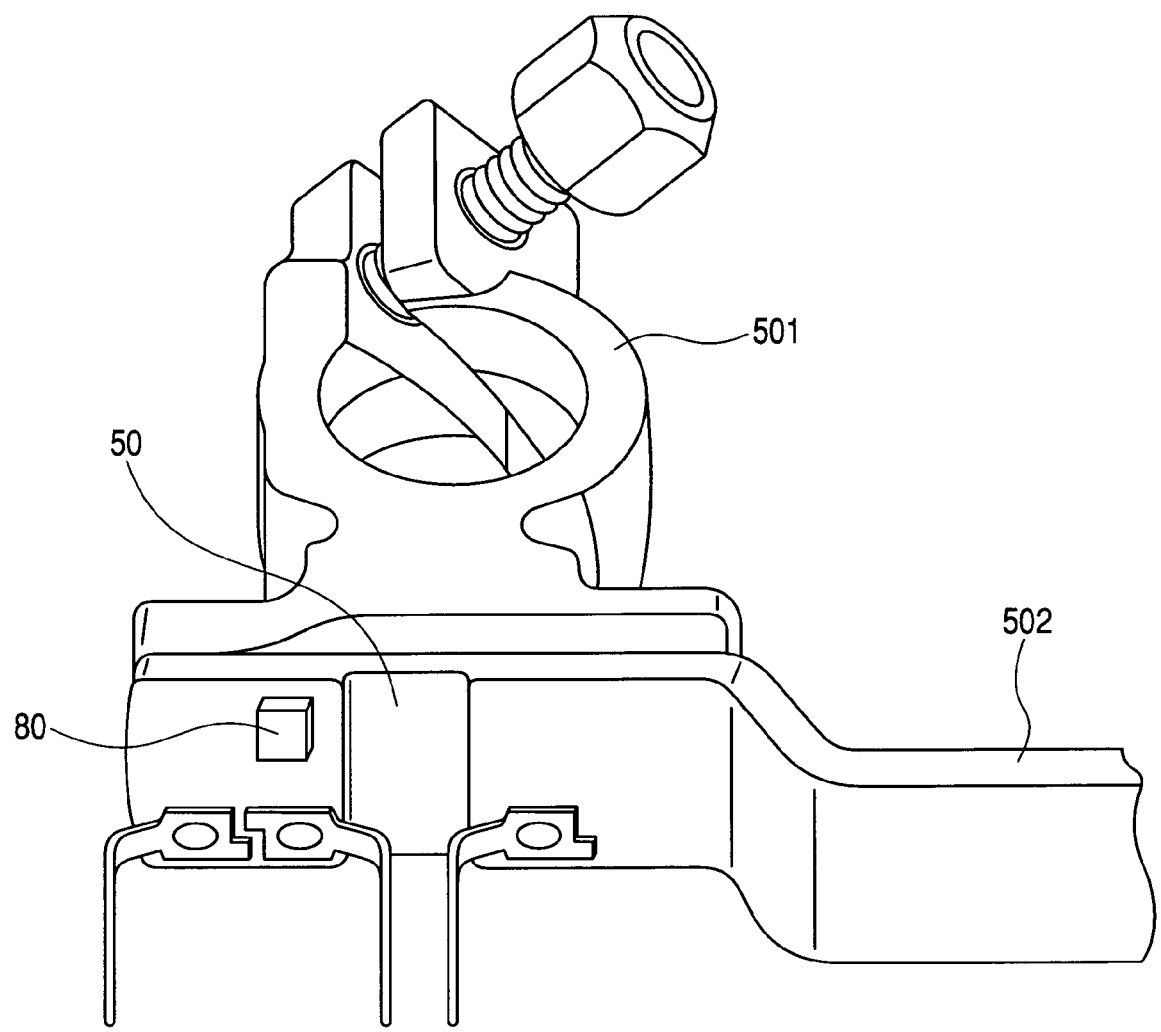
FIG. 4 is a perspective diagram of an assembled state of a shunt resistance and a temperature sensor, in particular, showing an actual assembled state of the shunt resistance to the temperature sensor.

FIG. 4 is a perspective diagram of an assembled state of the shunt resistance 50 and the temperature sensor 80. In particular, FIG. 4 shows an actual shape of the shunt resistance 50 and the assembled state of the temperature sensor 80 and the shunt resistance 50.

By the way, the mold resin, the battery current detection device 6, and other components are omitted from FIG. 4 for brevity. As shown in FIG. 4, the shunt resistance 50 is placed between the battery clamp 501 and the earth terminal 502. The temperature sensor 80 is fixed to the shunt resistance 50 at the battery clamp 501 side. It is so designed that the temperature sensor 80 detects the temperature of the shunt resistance 50. Thus, the temperature sensor 80 is placed near the battery clamp 501 which is electrically connected to the negative (−) terminal of the battery 5.

Accordingly, because the temperature of the shunt resistance 50 detected by the temperature sensor 80 and the actual temperature of the battery has a strong correlation, it is possible to detect the temperature of the battery 5 with high accuracy based on the detection result of the temperature sensor 80.

When receiving the charge and discharge current, the terminal voltage, and the temperature of the battery 5 transferred from the current detection unit 6A, the voltage detection unit 6B, and the temperature sensor 80, the charging control circuit 6C judges the battery condition of the battery 5 based on the received those data. The charging control circuit 6C then determines the regulation voltage for the vehicle alternator 3, and transfers the generation control signal including the regulation voltage to the electric power generation control device 4 through the connector 503 and the digital communication line.

It is possible to add other data items such as the detection value of the temperature sensor 80, faulty information of the vehicle control system, and the like in addition to the regulation voltage to be transferred to the electric power generation control device 4 from the battery current detection device 6 through the digital communication.

Still further, as far as using the bi-directional communication, the electric power generation control device 4 transfers an echo-back signal to the charging control circuit 6C in order to improve the reliability of the digital data communication. Still further, it is also possible that the electric power generation control device 4 transfers various data items regarding the current generation condition of the vehicle alternator 3 to the charging control circuit 6C.

According to the battery current detection device 6 in the vehicle control system of the embodiment described above, because the temperature sensor 80 is placed at the optimum position to have a strong correlation with the battery temperature of the battery 5, it is possible to detect the temperature of the battery 5 as well as the temperature of the shunt resistance 50 using the temperature sensor 80. Thus, the structure of the vehicle control system according to the present invention can provide a cheap and accurate method of detecting the temperature of the battery 5. This structure allows the vehicle control system to perform the charging and discharging control for the battery 5 with high accuracy based on the battery temperature Still further, because the structure of the vehicle control system according to the present invention does not limit the location to place the battery 5 in the vehicle, it is possible to improve the mounting capability of the battery 5 to the vehicle. Furthermore, because the structure of the vehicle control system according to the present invention can detect the temperature of the shunt resistance 50 with high accuracy, it is possible to compensate the temperature characteristics of the shunt resistance 50 with high accuracy, and also to use the shunt resistance 50 made of cheap material of a large temperature coefficient. It is thereby possible to reduce the manufacturing cost of the vehicle control system.

The scope of the present invention is not limited by the embodiment described above, it is possible to apply the concept of the present invention to various modifications. For example, although the temperature sensor 80 is placed on the shunt resistance 50, it is possible to place the temperature sensor 80 on a conductor which connects the shunt resistance 50 and the battery 5.

(Features and Effects of the Present Invention)

According to another aspect of the present invention, it is preferable that the battery current detection device has a shunt resistance, and detects the charging and discharging current of the battery using the shunt resistance. It is also preferable to place the temperature sensor onto the shunt resistance or on a conductor through which the shunt resistance and the battery are electrically connected to each other. It is further preferable to assemble the battery current detection device and a terminal together, and through the terminal, the current of the battery flows. Still further, it is preferable for the battery current detection device to compensate the temperature characteristics of the shunt resistance based on the temperature detected by the temperature sensor, and then to detect the charging and discharging current of the battery.

In general, a shunt resistance made of cheap material has a large fluctuation of its temperature characteristics. Using a combination of the shunt resistance and the temperature sensor can eliminate this drawback. Because the structure of the vehicle control system according to the present invention uses such a combination of the shunt resistance and the temperature sensor, it is possible to decrease the manufacturing cost of the vehicle control device. In general, the material forming a shunt resistance has a large resistance value when compared with that of a usual electrical wire. This drawback can be eliminated by placing the temperature sensor on the shunt resistance or on the conductor through which the shunt resistance is electrically connected to the battery, or by assembling the temperature sensor and the terminal of the battery together. The structure of the battery current detection device in the vehicle control system according to the present invention can estimate (or detect) the temperature of the battery with high accuracy, and decrease its manufacturing cost.

According to another aspect of the present invention, it is preferred for the battery current detection device to have a charging and discharging control circuit that sets the regulation voltage to be controlled by the voltage regulation device based on the temperature detected by the temperature sensor.

According to another aspect of the present invention, it is also preferable for the battery current detection device to have a charging and discharging control circuit that sets the regulation voltage which is controlled by the voltage regulation device based on the detected charging and discharging current and the temperature detected by the temperature sensor. By incorporating the charging and discharging control circuit into the battery current detection device, it is possible to set the regulation voltage without any influence of noise.

According to another aspect of the present invention, the battery current detection device is attached to a negative terminal of the battery. A large amount of current into/from the battery is supplied to the battery current detection device. Because the negative terminal of the battery does not make a short circuit when the vehicle collides with a vehicle or an obstacle, the structure to electrically connect the battery current detection device to the negative terminal of the battery does not limit the location of the battery to be placed in the vehicle. In particular, because the battery current detection device is electrically connected to the negative terminal of the battery, this structure is free from any limitation of the location of the battery in the vehicle. Thus, this structure provides the feature to suppress the rise of the manufacturing cost of the battery current detection device.

According to another aspect of the present invention, it is preferable to perform a digital data transmission between the battery current detection device and the voltage regulation device. Using digital data transmission can improve the data transmission reliability when compared with analogue data transmission.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A vehicle control system comprising:
   a battery mounted to a vehicle;
   a vehicle alternator configured to generate electric power and charge the electric power to the battery;
   a battery current detection device configured to detect charging and discharging current of the battery;
   a voltage regulation device configured to adjust an output voltage of the vehicle alternator to a specified output voltage; and
   a temperature sensor mounted to the inside of the battery current detection device, configured to detect a temperature of the battery and a temperature of a shunt resistance, wherein
   the battery current detection device and a battery clamp connected to a terminal of the battery are assembled together,
   temperature characteristics of the shunt resistance are compensated on the basis of the temperature of the shunt resistance detected by the temperature sensor,
   the battery current detection device detects the charging and discharging current of the battery on the basis of the shunt resistance having the compensated temperature characteristics, and
   the temperature sensor is mounted onto the shunt resistance which faces a side of the battery clamp or onto a conductor through which the shunt resistance and the battery are electrically connected together.

2. The vehicle control system according to claim 1, wherein the battery current detection device and the terminal of the battery are assembled together, where a current flows from the battery to the outside of the battery through the terminal.

3. The vehicle control system according to claim 1, wherein the battery current detection device comprises a charging and discharging control circuit that sets a regulation voltage which is controlled by the voltage regulation device based on the temperature detected by the temperature sensor.

4. The vehicle control system according to claim 1, wherein the battery current detection device comprises a charging and discharging control circuit that sets a regulation voltage to be controlled by the voltage regulation device based on the detected charging and discharging current and the temperature detected by the temperature sensor.

5. The vehicle control system according to claim 1, wherein the battery current detection device is attached to a negative terminal of the battery.

6. The vehicle control system according to claim 1, wherein a digital data transmission is performed between the battery current detection device and the voltage regulation device.

* * * * *